(12) United States Patent
Robin

(10) Patent No.: US 10,964,623 B2
(45) Date of Patent: Mar. 30, 2021

(54) ELECTRONIC MODULE AND METHOD FOR ENCAPSULATION THEREOF

(71) Applicant: ZF Friedrichshafen AG, Friedrichshafen (DE)

(72) Inventor: Hermann Josef Robin, Regensburg (DE)

(73) Assignee: ZF FRIEDRICHSHAFEN AG, Friedrichshafen (DE)

(*) Notice: Subject to any disclaimer, the term of this patent is extended or adjusted under 35 U.S.C. 154(b) by 0 days.

(21) Appl. No.: 15/568,326

(22) PCT Filed: Mar. 22, 2016

(86) PCT No.: PCT/EP2016/056186
§ 371 (c)(1),
(2) Date: Oct. 20, 2017

(87) PCT Pub. No.: WO2016/169711
PCT Pub. Date: Oct. 27, 2016

(65) Prior Publication Data
US 2018/0102304 A1    Apr. 12, 2018

(30) Foreign Application Priority Data

Apr. 22, 2015    (DE) .................. 10 2015 207 310

(51) Int. Cl.
*H01L 23/433*    (2006.01)
*H05K 5/00*    (2006.01)
(Continued)

(52) U.S. Cl.
CPC ...... *H01L 23/4334* (2013.01); *H01L 23/3107* (2013.01); *H01L 23/3672* (2013.01);
(Continued)

(58) Field of Classification Search
None
See application file for complete search history.

(56) References Cited

U.S. PATENT DOCUMENTS 6,441,503 B1 *   8/2002   Webster .............. G01L 19/0645
                                                   257/417
9,532,460 B2 *   12/2016  Meier .................... H05K 1/144
(Continued)

FOREIGN PATENT DOCUMENTS

DE    2010 062 653 A1    6/2012
DE    102010062761 A1    6/2012
(Continued)

OTHER PUBLICATIONS

International Report on Patentability from corresponding International Application No. PCT/EP2016/056186, 11pp., dated Jul. 19, 2017.

(Continued)

*Primary Examiner* — Nishath Yasmeen
(74) *Attorney, Agent, or Firm* — Brinks Gilson & Lione

(57) ABSTRACT

An electronic module of a control device of a vehicle includes at least one interconnect device, with electronic structural elements as the control unit, and at least one electronic component electrically connected to the interconnect device via a connecting region, wherein the structural elements of the interconnect device and each connecting region between the interconnect device and each dedicated electronic component are coated with an encapsulating material. Furthermore, a method for encapsulating an electronic module is disclosed.

17 Claims, 1 Drawing Sheet

(51) Int. Cl.
  *H01L 23/31* (2006.01)
  *H01L 23/367* (2006.01)
  *H01L 23/495* (2006.01)
  *H01L 23/522* (2006.01)

(52) U.S. Cl.
  CPC .... *H01L 23/49575* (2013.01); *H01L 23/5226* (2013.01); *H05K 5/0082* (2013.01); *H01L 2924/181* (2013.01); *H01L 2924/19107* (2013.01)

(56) References Cited

U.S. PATENT DOCUMENTS

| | | | | |
|---|---|---|---|---|
| 9,532,560 | B2* | 1/2017 | Osinga | A01M 1/2016 |
| 2004/0212965 | A1* | 10/2004 | Ishii | H01L 23/473 |
| | | | | 361/709 |
| 2005/0231925 | A1* | 10/2005 | Fukuda | H01L 24/49 |
| | | | | 361/760 |
| 2008/0170372 | A1* | 7/2008 | Kirigaya | H01L 25/165 |
| | | | | 361/720 |
| 2011/0044005 | A1* | 2/2011 | Wetzel | H05K 5/0082 |
| | | | | 361/714 |
| 2012/0092842 | A1* | 4/2012 | Neumeister | H01L 23/3135 |
| | | | | 361/761 |
| 2013/0314878 | A1* | 11/2013 | Ott | H05K 5/062 |
| | | | | 361/720 |
| 2014/0362535 | A1* | 12/2014 | Meier | H01L 23/4985 |
| | | | | 361/707 |
| 2015/0029669 | A1* | 1/2015 | Liskow | F16H 61/0006 |
| | | | | 361/709 |
| 2015/0359107 | A1* | 12/2015 | Steinau | H01L 23/49531 |
| | | | | 361/709 |

FOREIGN PATENT DOCUMENTS

| | | | |
|---|---|---|---|
| DE | 10 2012222199 A1 | 6/2014 | |
| EP | 1 460 688 A2 | 9/2004 | |
| WO | WO-2013091962 A1 * | 6/2013 | ............. H05K 1/141 |

OTHER PUBLICATIONS

Written Opinion and International Search Report from corresponding International Application No. PCT/EP2016/056186, 14pp., dated Apr. 19, 2017.

* cited by examiner

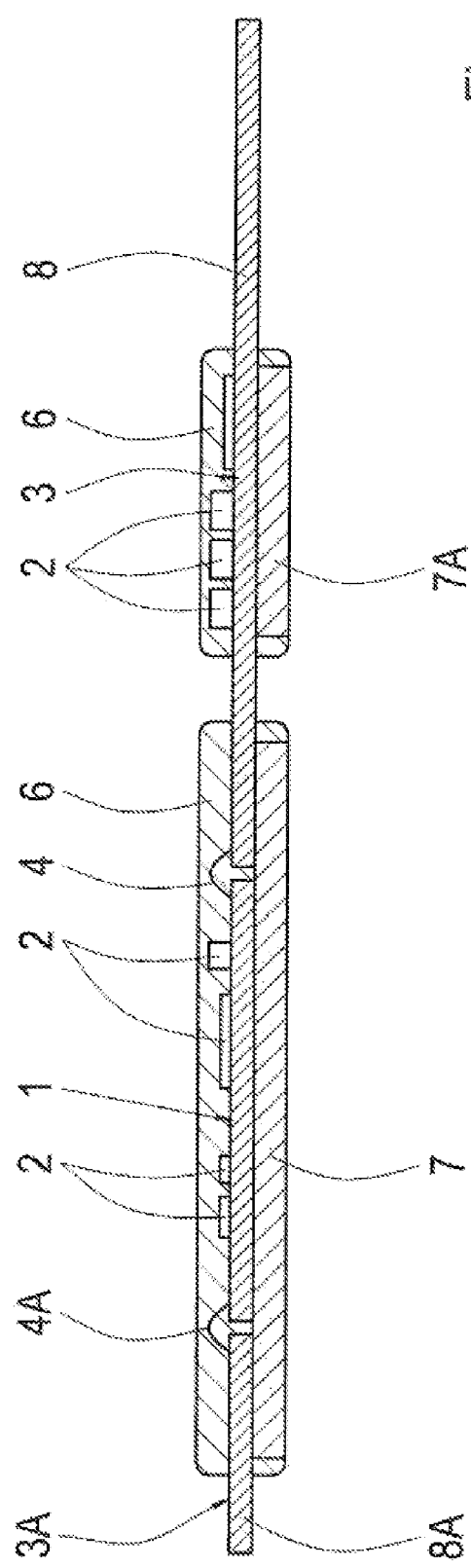
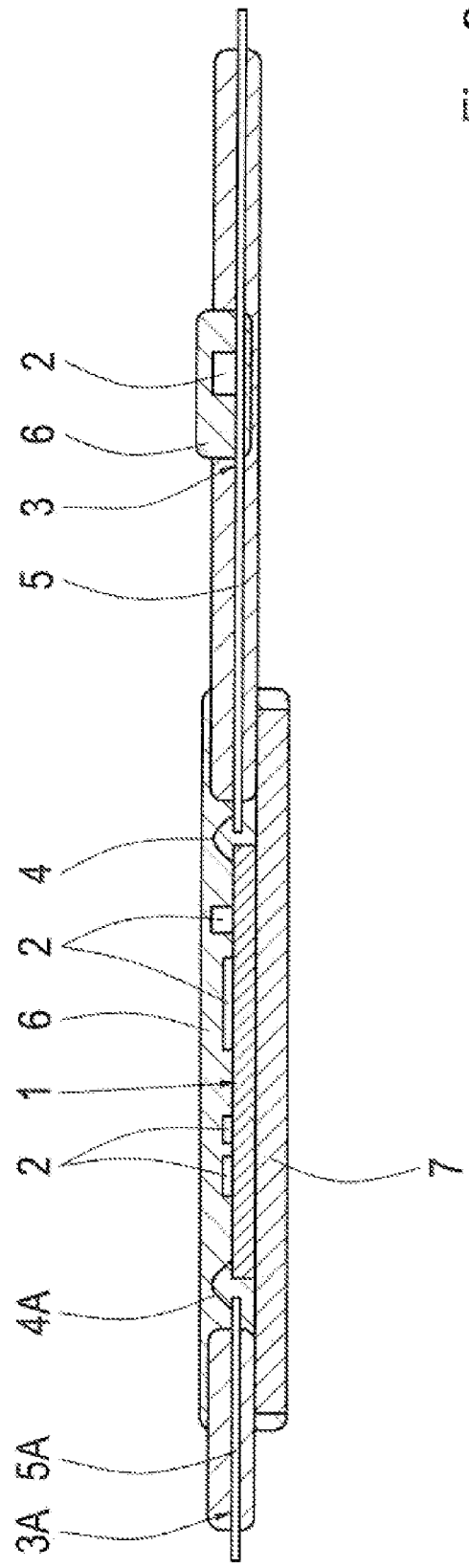

ELECTRONIC MODULE AND METHOD FOR ENCAPSULATION THEREOF

RELATED APPLICATIONS

This application is a filing under 35 U.S.C. § 371 of International Patent Application PCT/EP2016/056186, filed Mar. 22, 2016, and claims the priority of DE 10 2015 207 310.6, filed Apr. 22, 2015, both of which are incorporated by reference herein in their entirety.

BACKGROUND

1. Field of the Invention

The present invention relates to an electronic module of a control device of a vehicle, and a method for encapsulating the electronic module.

2. Description of the Related Art

By way of example, an electronic module and a method for the production of an electronic module are known from WO 2013/178380 A1. The electronic module is provided for use with an electronic control device. The electronic module comprises a printed circuit board located in a molded housing. Electronic structural elements are provided on the printed circuit board. The printed circuit board, along with the structural elements, is encompassed by a molded housing. Electronic connecting elements extend out of the molded housing, to which further printed circuit boards are connected, which ultimately must be connected to the distributor level of the control device. The connections provided, and the additional connecting regions are disposed outside the molded housing, and are thus not protected from external effects, and can thus be damaged by shavings and other media.

With known electronic modules, an additional housing is necessary, which is extensively sealed by means of a molded seal, in order to protect the interior from the effects of media. The connecting regions of the electronics for signal distribution are extensively protected from the effects of oil and shavings through a mechanical separation. Additional components and additional steps during the production are necessary for this, increasing the production costs.

SUMMARY

The present invention addresses the object of proposing an electronic module and a method for encapsulation thereof, which is particularly inexpensive.

This object is achieved according to the invention by the features of Claim 1 and Claim 7, wherein advantageous designs can be derived from the respective dependent Claims and the description, as well as the drawings.

Thus, an electronic module of a control device of a vehicle, which has at least one interconnect device with electronic structural elements serving as a control unit, and at least one electronic component, is proposed, each of which has an electronic connection or signal connection to the interconnect device. The structural elements of the interconnect device that are to be protected against external effects, as well as the respective connecting region between the interconnect device and the dedicated electronic components are coated with encapsulating material.

In this manner, a cost-optimized construction concept for an integrated electronic control, which has electronic and connection encapsulation for protection against external effects, is created. Consequently, not only the electronics, but also the electrical connecting regions of the interconnect device, are protected from media and shavings. A plastic is used as the encapsulating material, preferably thermoset EP material, such as epoxide resin, optionally with filler. This results in the advantage that thermosetting material can be applied in a process in order to protect the electronics, as well as for the contacting or bonding. By way of example, an injection molding, transfer molding, or compression molding process can be used as the coating or encapsulating process.

The interconnect device can be populated in the framework of an advantageous development with at least one electronic component or structural element, preferably on one side, wherein the other side can be used for a thermal bonding to a heat sink. The heat sink can thus be used for a mechanical and thermal bonding to a heat sink, and advantageously assumes a dual function.

So-called distributor printed circuit boards, which have a printed circuit board or a flex-foil can be used as the electronic components, on which the electronic structural elements are disposed. Single- or multi-layered printed circuit boards can be used. The distributor PCBs can preferably be flexible, in order to form sensor domes, for example, as structural elements. It is also conceivable that a lead frame is provided as an electronic component, with electronic structural elements attached thereto. Independently of the respective configuration, the electronic components may be provided with a heat sink, in particular when designed as a output unit, e.g. for activating pumps or suchlike. For this, the heat sink, e.g. in the form of an aluminum body, can be glued to the lead frame or the printed circuit board, e.g. by means of a heat-conductive adhesive. It can preferably be connected to the heat sink of the interconnect device, such that a shared thermal connection is obtained.

A preferred development of the invention can provide that the electronic components are coated with an encapsulating material.

A preferred development of the invention can provide that the interconnect device having the electronic components can be disposed and attached in a transmission housing as a transmission control device. In this manner, an inexpensive structural concept for an integrated transmission control, having the thermoset coating, can be implemented in a transmission housing, wherein, e.g., a heat sink on a wall of the transmission housing is used for mechanical and thermal bonding of the interconnect device, e.g. via the heat sink.

The fundamental object of the invention is also achieved by a method for encapsulating an electronic module, in which electronic structural elements of the interconnect device, and the electronic components of both the connecting region between the interconnect device and the respective electronic components of the electronic module, are coated. As a result, protection is obtained for the structural elements as well as for the connecting regions by the coating, molding, or through a grouting.

BRIEF DESCRIPTION OF THE DRAWINGS

The present invention shall be explained in greater detail below based on the drawings. Therein:

FIG. 1 shows a schematic view of a first embodiment variation of an electronic module according to the invention; and FIG. 2 show a schematic view of a second embodiment variation of the electronic module.

DETAILED DESCRIPTION

Different embodiment variations of an electronic module according to the invention, as a control device, preferably as a transmission control device of a vehicle, are depicted by way of example in FIGS. 1 and 2.

The electronic module comprises an interconnect device 1, e.g. as an LTCC or HDI-PCB, which forms a control unit having numerous electronic structural elements 2. Furthermore, the electronic module comprises at least one electronic component 3, 3A, which is, or are, connected to the interconnect device 1 via an electric or signal technology connecting region 4. By way of example, cables, wires, or aluminum heavy wire bonds, can be used as the connecting region. Both the electronic or structural elements 2 of the interconnect device 1 and of the electronic components 3, 3A, as well as the respective connecting regions 4, 4A between the interconnect device 1 and the respective electronic components 3, 3A are coated with encapsulating material 6. In this manner, an electronic module protected against external effects is obtained, in which the aforementioned regions are coated or cast.

Independently of the depicted embodiment variations, the interconnect device 1 is populated on one side with structural elements 2, and has a heat sink 7 on the side of the interconnect device 1 facing away from the structural elements 2, for thermal bonding. In this manner, with the proposed electronic module, both the mechanical as well as the thermal bonding can be obtained via the heat sink 7 of the interconnect device 1. By way of example, the heat sink 7 can be connected to a heat sink on a wall in a transmission housing. For this, the heat sink 7, made of aluminum, for example, can be glued to the interconnect device with a heat-conducting adhesive. The heat sink 7 thus basically forms a supporting body, by means of which, both the mechanical stability and the thermal bonding are obtained.

The proposed electronic module is depicted in FIG. 1, wherein the interconnect device 1 is connected to an electronic component 3 via a first connecting region 4, e.g. as an output unit or suppressor module. The output unit can be used, for example, for activating a pump. The other electronic components 3A can be provided for receiving sensors or connecting plugs.

As can be seen in FIG. 1, the electronic structural elements 2 of the interconnect device 1 and the electronic components 3, 3A are coated with encapsulating material 6. Moreover, the connecting regions 4, 4A, for both the first electronic component 3 as well as for the second electronic component 3A, are likewise coated with encapsulating material 6.

Because the electronic component 3 in the form of an output unit generates a lot of heat, the side of the printed circuit board 8 having the electronic component 3, facing away from the structural element 2, is also provided with a heat sink 7A.

An alternative embodiment variation is shown in FIG. 2, in which, in differing from the first embodiment variation, the electronic component 3, 3A is provided with a coated lead frame 5, 5A, instead of a distributor PCB. The lead frame 5, 5A is connected, for example, to the heat sink 7 of the interconnect device 1.

Independently of the two depicted embodiment variations, an electronic module encapsulated at the surfaces that are to be protected, which can be attached, as a transmission control device, to a wall in a transmission housing in a simple manner, e.g., via the heat sink 7 or 7A.

REFERENCE SYMBOLS 1 interconnect device
2 structural element
3, 3A electronic component
4, 4A electrical connecting region
5, 5A lead frame
6 encapsulating material or coating material
7, 7A heat sink
8, 8A printed circuit board

What is claimed is:

1. An electronic module of a control device of a vehicle, comprising:
at least one interconnect device including a first side and a second side opposing the first side, a plurality of electronic structural elements on the first side forming a control unit, at least one electronic component electrically connected to the at least one interconnect device via a connecting region, and
a first heat sink having a first surface contacting the second side of the interconnect device at a first area of the first surface, and a second surface opposing the first surface configured to contact a second heat sink at a second area of the second surface, the second area of the second surface directly opposing the first area of the first surface,
wherein the plurality of electronic structural elements of the at least one interconnect device, the connecting region, and at least a portion of the at least one electronic component are coated with an encapsulating material, wherein the encapsulating material forms a first encapsulated housing of the electronic module encapsulating the interconnect device, the connecting region, and the at least the portion of the at least one electronic component, and around an entirety of a periphery of the second surface of the first heat sink, and wherein the encapsulating material makes direct contact with the second surface of the first heat sink.

2. The electronic module according to claim 1, wherein the at least one interconnect device is disposed as a transmission control device in a transmission housing.

3. The electronic module according to claim 2, wherein the second heat sink comprises a wall of the transmission housing, and the second surface of the first heat sink contacts the wall of the transmission housing.

4. The electronic module according to claim 1, wherein the at least one electronic component comprises a printed circuit board having coated structural elements or a lead frame having coated structural elements, which are connected to the at least one interconnect device via the connecting region.

5. The electronic module according to claim 4, wherein the at least one electronic component serves as an output unit, and the printed circuit board or the lead frame is connected to the second heat sink, which contacts the first heat sink of the interconnect device.

6. An electronic module of a control device of a vehicle, comprising:
an interconnect device including a first side and a second side opposite the first side, an electronic structural element on the first side, the electronic structural element at least partially forming a control unit;
a heat sink on the second side of the interconnect device, the second side of the interconnect device facing away from the electronic structural element, the heat sink having a first surface configured to contact the second side of the interconnect device at a first area of the surface, and a second surface opposing the first surface configured to contact a housing at a second area of the second surface, the second area of the second surface directly opposing the first area of the first surface;

an electronic component;

a connecting region electrically connecting the electronic component to the interconnect device; and an encapsulating material encapsulating the electronic structural element, the connecting region, and at least a portion of the electronic component, the encapsulating material forming a first encapsulated housing encapsulating the electronic structural element, the connecting region, and the at least the portion of the electronic component, and formed around an entirety of a periphery of the second surface of the heat sink, and making direct contact with the periphery of the second surface of the heat sink.

7. The electronic module according to claim 6, wherein the interconnect device and the electronic component are disposed as a transmission control device in a transmission housing.

8. The electronic module according to claim 7, wherein the second area of the second surface contacts a wall of the transmission housing, serving as a second heat sink.

9. The electronic module according to claim 6, wherein the electronic component comprises a printed circuit board including a coated structural element connected to the interconnect device via the connecting region.

10. The electronic module according to claim 9, wherein the electronic component comprises an output unit, and the printed circuit board is connected to a second heat sink contacting the heat sink.

11. The electronic module according to claim 6, wherein the electronic component comprises a lead frame including a coated structural element connected to the interconnect device via the connecting region.

12. The electronic module according to claim 1, wherein the at least one electronic component comprises a flexible printed circuit board.

13. The electronic module according to claim 1, wherein a second portion of the at least one electronic component is coated with the encapsulating material, wherein the encapsulating material forms a second encapsulated housing of the electronic module encapsulating the second portion of the at least one electronic component, wherein the first encapsulated housing and the second encapsulated housing are separate housing.

14. The electronic module according to claim 13, wherein at least a third portion of the at least one electronic component located between the first encapsulated housing and the second encapsulated housing is not encapsulated by the encapsulating material.

15. The electronic module according to claim 1, further comprising a third heat sink different from the first heat sink, the third heat sink comprising:

a first surface contacting at least one surface of the electronic component at a first area of the first surface, and a second surface opposing the first surface of the second heat sink configured to contact the second heat sink at a second area of the second surface of the third heat sink, wherein the second area of the second surface of the third heat sink directly opposing the first area of the first surface of the third heat sink.

16. The electronic module according to claim 15, wherein the first area of the first surface of the third heat sink contacts the at least one surface of the electronic component at a second portion of the at least one electronic component that is separate from the first portion of the at least one electronic component, and wherein the second portion of the at least one electronic component is coated with the encapsulating material, wherein the encapsulating material forms a second encapsulated housing of the electronic module encapsulating the second portion of the at least one electronic component and around an entirety of a periphery of the second surface of the third heat sink, wherein the first encapsulated housing and the second encapsulated housing are separate housing.

17. The electronic module according to claim 1, wherein the first surface of the first heat sink also contacts a surface of the at least a portion of the at least one electronic component.

* * * * *